(12) United States Patent
Savoj

(10) Patent No.: US 8,472,515 B1
(45) Date of Patent: Jun. 25, 2013

(54) CLOCK AND DATA RECOVERY CIRCUIT WITH DECISION FEEDBACK EQUALIZATION

(75) Inventor: Jafar Savoj, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 92 days.

(21) Appl. No.: 13/185,724

(22) Filed: Jul. 19, 2011

(51) Int. Cl.
*H03H 7/30* (2006.01)
*H03H 7/40* (2006.01)
*H03K 5/159* (2006.01)

(52) U.S. Cl.
USPC ........... 375/233; 375/374; 375/375; 375/376; 327/157; 327/159; 398/154; 398/155

(58) Field of Classification Search
USPC .................. 327/157, 159; 375/374, 375, 376, 375/233; 398/154, 155
See application file for complete search history.

(56) References Cited

U.S. PATENT DOCUMENTS 6,847,789 B2 * 1/2005 Savoj .............................. 398/155
7,016,613 B2   3/2006 Savoj
7,715,474 B2 * 5/2010 Park et al. ..................... 375/233

OTHER PUBLICATIONS

Koon-Lun Wong et al., "A 5-mW 6-Gb/s Quarter-Rate Sampling Receiver with a 2-Tap DFE Using Soft Decisions", 2007, IEEE, total of 8 pages.*
Savoj, Jafar, "A 10-Gb/s CMOS Clock and Data Recovery Circuit with a Half-Rate Linear Phase Detector," *IEEE Journal of Solid-State Circuits*, May 2001, pp. 761-768, vol. 36, No. 5, IEEE, Piscataway, New Jersey, USA.
Wong, Koon-Lun Jackie et al., "A 5-mW 6-Gb/s Quarter-Rate Sampling Receiver with a 2-Tap DFE Using Soft Decisions," *IEEE Journal of Solid-State Circuits*, Apr. 2007, pp. 881-888, vol. 42, No. 4, IEEE, Piscataway, New Jersey, USA.

* cited by examiner

*Primary Examiner* — Sam K Ahn
*Assistant Examiner* — Fabricio R Murillo Garcia
(74) *Attorney, Agent, or Firm* — LeRoy D. Maunu; Lois D. Cartier

(57) ABSTRACT

A phase detection and decision feedback equalization circuit is provided. A first latch and a second latch are coupled to an input of the circuit. A third latch and a fourth latch are respectively coupled in series to outputs of the first latch and second latch. The first and fourth latches are enabled by a clock signal, and the second and third latches are enabled by a complement of the clock signal. A first feedback circuit is configured to provide a signal output from the first latch and a first feedback signal derived from the output of the fourth latch to an input of the third latch. A second feedback circuit is configured to provide a signal output from the second latch and a second feedback signal derived from the output of the third latch to an input of the fourth latch.

17 Claims, 6 Drawing Sheets

CLOCK AND DATA RECOVERY CIRCUIT WITH DECISION FEEDBACK EQUALIZATION

FIELD OF THE INVENTION

One or more embodiments generally relate to phase detection and more particularly to clock and data recovery circuits with decision feedback equalization.

BACKGROUND

Data transmission media often distort data signals, making it difficult for transmitted data signals to be read by a receiving device. For example, twisted pair cables have filtering properties that tend to attenuate higher frequencies. This limited bandwidth also creates interference between individual data bits, known as inter-symbol interference. Wireless signals may reflect off buildings and other surfaces resulting in a signal traveling multiple paths of different lengths. As a result, reflections may be received at a receiver at different times resulting in adjacent bits overlapping one another in a composite of the reflected signals.

An ideal received data signal would have a series of square-wave-type pulses. However, incoming transmitted signals are not perfect. Deviation from ideality can be caused by frequency-dependent attenuation of the channel over which the data is transmitted. For example, if the channel, such as a wire trace on a printed circuit board or transmission line, presents more attenuation at higher frequencies than at lower frequencies, phase distortion of the incoming digital data stream can occur.

Inter-symbol interference (ISI) causes bits in a transmitted signal to differ from an ideal signal. Each bit of incoming data is "stretched" so that its tail falls over adjacent bits and other bits in the data stream. The resultant incoming digital data stream has pulses with sloped leading and trailing edges and rounded corners. For example, the first bit adds a small amount of voltage to the second bit to produce a summed signal that is unlike either the first or the second bits.

In order to compensate for inter-symbol inference and other distortion, received data signals often must be retimed or phase shifted to align the data signals with a clock. Clock and data recovery circuits, such as phase locked loops, accept distorted data and provide a clock signal and retimed (or recovered) data as outputs.

Decision-feedback equalization ("DFE") is a technique to compensate for changes in the received data signal due to ISI. DFE applies a selected correction signal (e.g., voltage or current) to an input bit at a summing node in order to compensate for the frequency-dependent attenuation of the channel carrying the data to the receiver. In some systems, DFE essentially reverses the channel attenuation as a function of frequency. DFE techniques store sampled input data from and provide feedback of the stored data samples back into the data stream based on the frequency response of the data channel. Linear devices, such as linear gain amplifiers, provide a selected amount of feedback. However, in a typical architecture, the addition of DFE circuitry requires additional memory to store previous data bits and may introduce a large load on the high-speed clock, or add delay to the data feedback path.

One or more embodiments may address one or more of the above issues.

SUMMARY

In one embodiment, a combined phase detection and decision feedback equalization (PDDFE) circuit is provided. A first latch and a second latch are coupled to an input of the PDDFE circuit. The first latch is enabled by a clock signal, and the second latch is enabled by a complement of the clock signal. A third latch is coupled in series to an output of the first latch in a master-slave configuration, where the third latch is enabled by a complement of the clock signal. The third latch produces a first demultiplexed signal. A fourth latch is coupled in series to an output of the second latch in a master-slave configuration, where the fourth latch is enabled by the clock signal. The fourth latch produces a second demultiplexed signal. A first feedback circuit is arranged and configured to provide a signal output from the first latch and a first feedback signal derived from the second demultiplexed signal to an input of the third latch. A second feedback circuit is arranged and configured to provide a signal output from the second latch and a second feedback signal derived from the first demultiplexed signal to an input of the fourth latch.

In another embodiment, a clock and data recovery circuit is provided. A phase detection and decision feedback equalization (PDDFE) circuit is coupled to receive a clock signal and a data signal. The PDDFE circuit is configured to produce phase information and transition information based on the clock and data signals, determine data symbols from the data signal, and perform feedback correction of the data signal to reduce inter-symbol interference of the data symbols. A charge pump is coupled to the PDDFE circuit and is configured to generate an error signal based on the phase information and the transition information. A low-pass filter, having an input coupled to an output of the charge pump, is configured to filter the error signal. A voltage controlled oscillator is coupled to the low-pass filter and configured to convert the filtered error signal into an oscillating signal to produce the clock signal input to the PDDFE circuit.

In yet another embodiment, a method for recovering data from an input data signal is provided. The input data signal is received at a first data rate. A clock signal alternating between a high value and a low value is received at the first data rate. A first data signal is generated by inputting the input data signal to a first latch that is enabled by the high value of the clock signal. The output of the first latch is the first data signal. A second data signal is generated by inputting the data signal to a second latch that is enabled by the low value of the clock signal. The output of the second latch is the second data signal. A third data signal is generated by inputting the first data signal to a third latch that is enabled by the low value of the clock signal. The output of the third latch is the third data signal. A fourth data signal is generated by inputting the second data signal to a fourth latch that is enabled by the high value of the clock signal. The output of the fourth latch is the fourth data signal. Decision feedback equalization is performed by providing a first feedback signal derived from the third data signal to the fourth latch, and providing a second feedback signal derived from the fourth data signal to the third latch.

It will be appreciated that other embodiments are set forth in the Detailed Description and Claims, which follow.

BRIEF DESCRIPTION OF THE DRAWINGS

Various aspects and advantages will become apparent upon review of the following detailed description and upon reference to the drawings, in which.

DETAILED DESCRIPTION

In one or more embodiments, a hardware-efficient circuit is provided for performing phase detection and decision feedback equalization. The circuit implements decision feedback equalization (DFE) by utilizing memory latches to buffer data bits for phase detection. This arrangement allows the DFE to be implemented with reduced hardware expense. The arrangement may also reduce latency of the circuit by summing the feedback signals at an earlier stage than would a separate DFE circuit following the phase detection circuitry. Less delay in the data feedback path allows the correction signal to be summed with the incoming data sooner, resulting in more accurate equalization or higher-speed operation.

Figure 1:
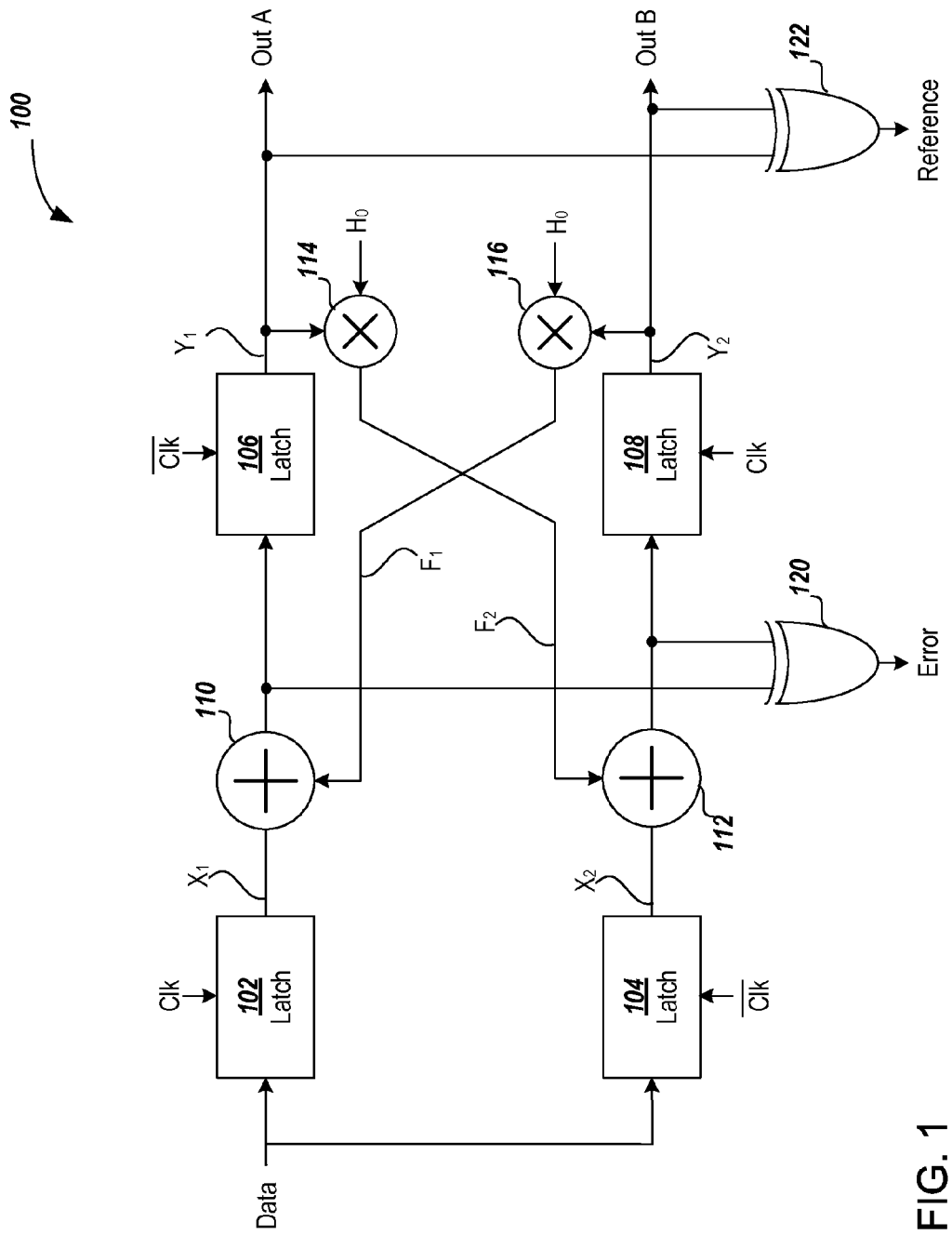
FIG. 1 shows a circuit diagram of a half-rate phase detector with decision feedback equalization.

FIG. 1 shows a circuit diagram of a half-rate phase detector with decision feedback equalization. It is understood that signal paths may be either single-ended or differential. For ease of illustration, signals are primarily illustrated as single-ended signals. A first latch 102 and a second latch 104 are coupled to a data input of the circuit 100. A third latch 106 is coupled in series with an output of the first latch 102 in a master-slave configuration, where the first latch is enabled by a clock signal, Clk, and the third latch by a complement of the clock signal, $\overline{Clk}$. A fourth latch 108 is coupled in series with an output of the second latch 104 in a master-slave configuration, where the second latch 104 is enabled by $\overline{Clk}$ and the fourth 108 latch is enabled by Clk.

Phase detection is performed using first and second XOR gates 120 and 122 to generate error and reference signals representing the phase difference between the clock Clk and the data input. The first XOR gate 120 is coupled to receive the signals produced from summing nodes 110 and 112 to produce an Error signal. The second XOR gate 122 is coupled to receive signals $Y_1$ and $Y_2$ output from the third and fourth latches 106 and 108 to produce a reference signal. The Error and Reference signals are described below.

Figure 2:
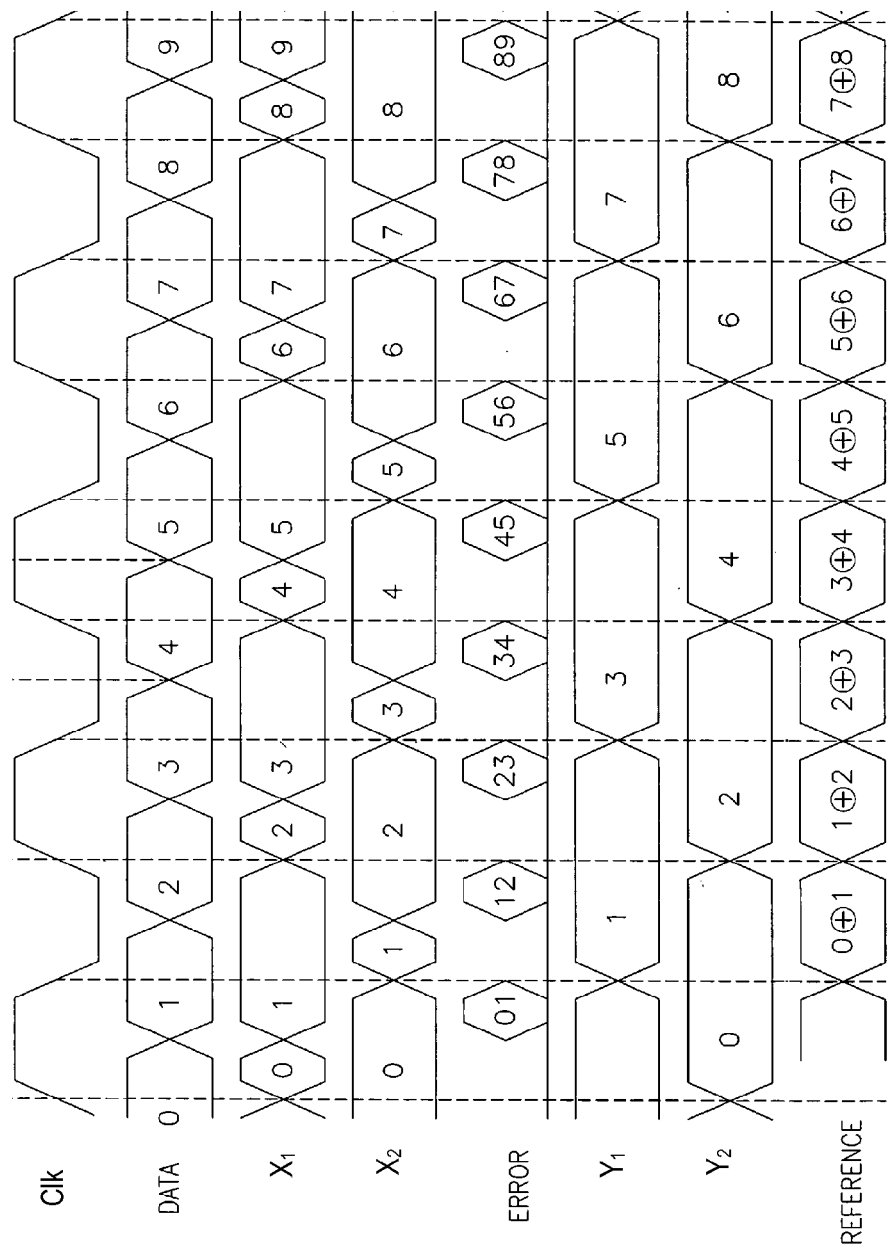
FIG. 2 shows various waveforms illustrating a phase detection process performed by the circuit shown FIG. 1.

The phase detection performed by the circuit is explained with reference to FIG. 2. FIG. 2 shows various waveforms illustrating the phase detection process performed by the circuit shown FIG. 1. For ease of illustration and explanation, phase detection is described without describing the effect of feedback circuitry 110, 112, 114, and 116. The effect of the feedback circuitry is discussed separately below. Ignoring feedback circuitry, signals $X_1$ and $X_2$ are input directly to XOR gate 120

Each of the latches is configured to track its input for one-half of a clock period and hold the value for the other half. The circuit demuxes a received data signal into two half-rate signals by clocking latches 102 and 104 with complementary clock signals Clk and $\overline{Clk}$ to produce signals $X_1$ and $X_2$. The two signals $X_1$ and $X_2$ differ because their corresponding latches operate on opposite clock edges. Signal $X_1$ follows the input DATA when clock signal Clk is high. When Clk turns low, the signal $X_1$ is stored in latch 102, and latch 102 does not respond to changes in DATA. Conversely, signal $X_2$ follows DATA when Clk is low. When Clk turns high, $X_2$ is stored in latch 104, and latch 104 does not respond to changes in DATA.

The signal $X_1$ is XORed with $X_2$ to produce the signal ERROR. For some time following each rising and falling edge of Clk, $X_1$ and $X_2$ are equal. This is because one signal has just been latched while the other signal had been previously latched and follows DATA. During this time period, the ERROR signal level is low. In other words, the ERROR signal is asserted high when the DATA signal transitions. If the DATA signal level remains constant, ERROR remains low.

Signal $Y_1$ follows signal $X_1$ when Clk is low. When Clk returns high, $Y_1$ is stored, and its value retained until Clk turns low. Conversely, signal $Y_2$, follows signal $X_2$ when Clk is high. When Clk turns low, signal $Y_2$ is stored and its value is retained until Clk turns high. Signals $Y_1$ and $Y_2$ are demultiplexed half-rate data outputs. For example, data bits of DATA have been sequentially labeled 0, 1, 2, and so on. Signal $Y_1$ includes the odd bits of DATA, and signal $Y_2$ includes even bits of DATA. In order to generate a full-rate output, the demultiplexed $Y_1$ and $Y_2$ signals may be combined by a multiplexer that operates on the half-rate clock as well. Signals $Y_1$ and $Y_2$ are XORed, resulting in the signal, REFERENCE.

The signal, ERROR, is dependent on the phase relationship between DATA and Clk in the following manner. For example, if bit 1 of DATA is low and bit 2 of DATA is high, then the ERROR pulse 12 is high. If Clk is delayed (shifted to the right), then pulse 12 of ERROR will become longer in duration. If Clk advances (shifted to the left), then pulse 12 of ERROR becomes shorter in duration. In contrast, if data bits 1 and 2 of DATA are equal, then pulse 12 of ERROR is low. Therefore, the average voltage of ERROR is dependent not only on the phase error between Clk and DATA, but also on the data pattern of bits of DATA. For this reason, ERROR may have more significance in the context of REFERENCE.

While the two XOR circuits 120 and 122 provide both the pulses of ERROR and REFERENCE for every data transition, the pulses of ERROR are only half as wide as the pulses of REFERENCE. Accordingly, the amplitude of ERROR is scaled-up by a factor of two with respect to REFERENCE so that the difference between their averages drops to zero when clock transitions are in the middle of the data eye. The phase error with respect to this point is then linearly proportional to the difference between the two averages.

In addition to phase detection, the circuit 100 shown in the circuit of FIG. 1 also implements a decision feedback equalization using first and second feedback circuits along with the latches that are used for phase detection. A DFE circuit equalizes previously sampled data bits are stored for a limited number of cycles. A scaled value of the stored data bits is added to or subtracted from a currently sampled data bit. In this manner, inter-symbol interference caused by previously received data bits may be substantially subtracted from the currently received data bit.

The arrangement shown in FIG. 1 efficiently uses the memory latches for both phase detection and for DFE bit storage. This arrangement allows the DFE to be implemented with fewer resources.

A first feedback circuit is configured to provide an input signal to the latch 106 based on the signal $X_1$ output from the latch 102 and a first feedback signal derived from the signal $Y_2$ which is output from the latch 108. The first feedback circuit includes a scaling circuit 116 that is configured to scale signal $Y_2$ by a coefficient, $H_0$, to produce a first feedback signal $F_1$ to the input of the latch 106 via summing node 110.

The summing node 110 is configured to sum the $X_1$ and $F_1$ signals to produce a first corrected signal that is input to the latch 106.

The second feedback circuit is configured to provide an input signal to the latch 108 based on the signal $X_2$ output from the latch 104 and a second feedback signal $F_2$ which is derived from the first demultiplexed signal $Y_1$. The second feedback circuit includes a second scaling circuit 114 that is configured to scale signal $Y_1$ by the coefficient $H_0$ to produce the second feedback signal $F_2$ which is input to the summing node 112. The summing node 112 is configured to sum signals $X_2$ and $F_2$ to produce a second corrected signal that is input to latch 108.

The scaling of the tap coefficient $H_0$ is tuned to cancel the inter-symbol interference contributions of the previous bits. In practice, this may be accomplished with the aid of an eye-monitoring circuit and adaptive tap-weight adjustment algorithm, for example.

The DFE circuitry shown in FIG. 1 implements a 1-tap DFE circuit. A tap refers to a coefficient/delay pair that is implemented by the DFE circuitry. The number of taps of an N-tap DFE circuit refers to the number of filter coefficients implemented. In general, increasing the number of taps increases stopband attenuation, reduces ripple, and allows for narrower filters. However, a greater number of taps requires additional latches. It is understood that the phase detection and DFE circuit may be implemented with any number of taps.

Figure 3:
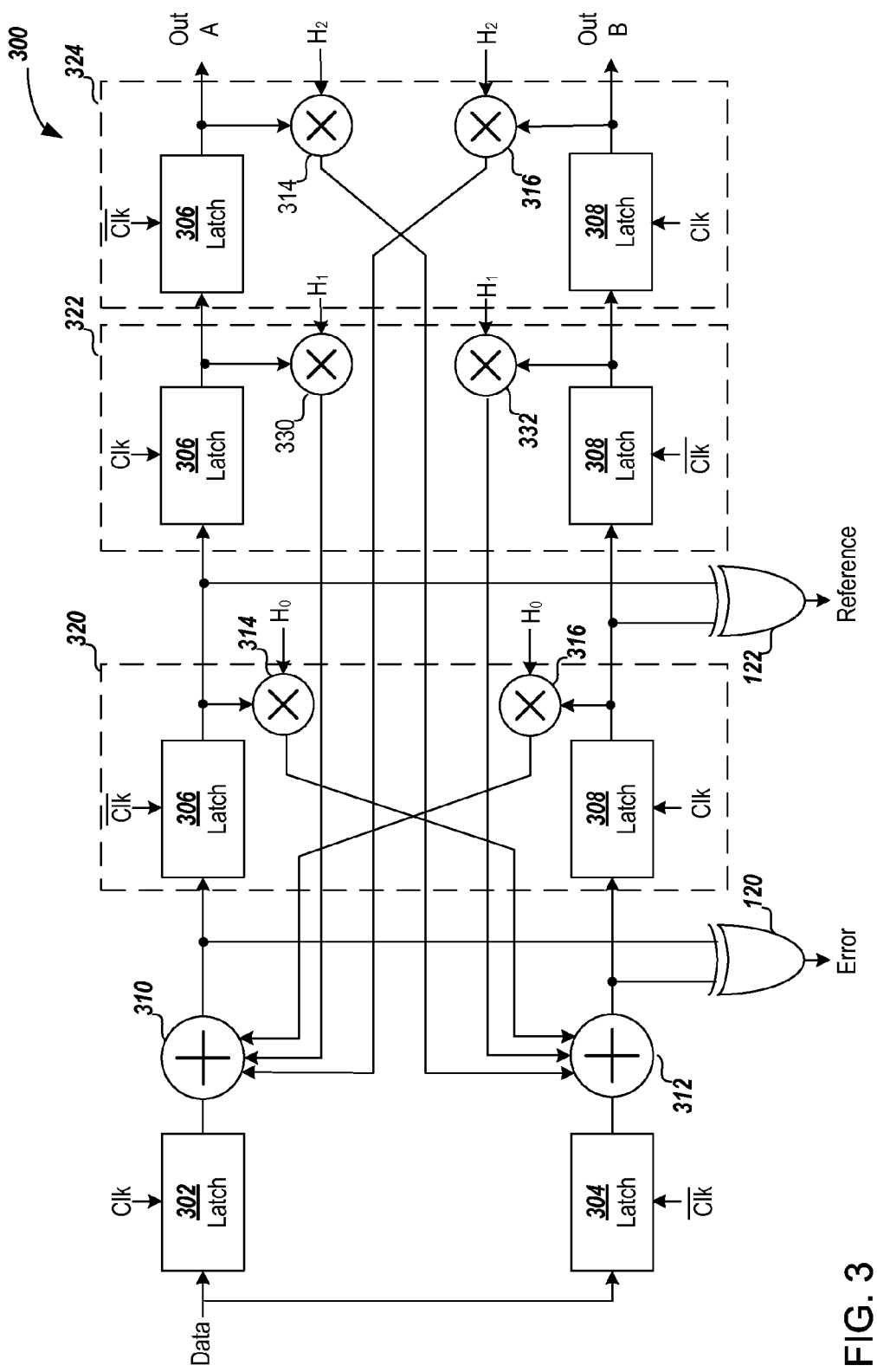
FIG. 3 shows a circuit diagram of a phase detection circuit having 3-tap DFE circuitry.

FIG. 3 shows a circuit diagram of a phase detection circuit having 3-tap DFE circuitry. Similar to the circuit shown in FIG. 1, first and second latches 302 and 304 are coupled to an input of the circuit 300. The first latch 302 is enabled by a clock signal and the second latch 304 is enabled by the complement of the clock signal.

For each tap i in the 3-tap DFE circuit, $1 \leq i \leq 3$, the DFE circuitry includes a DFE stage having first and second additional latches coupled to buffer previous data values. As discussed with reference to FIG. 1, a first DFE stage (i=1) 320 is implemented using latches 306 and 308 that are also used for phase detection. The first additional latch 306 of stage 320 has an input coupled to an output of the first summing node 310 and is enabled by the complement of the clock used to enable the first latch 302. The second additional latch 308 of stage 320 has an input coupled to an output of summing node 312 and is enabled by the complement of the clock used to enable the second latch 304.

For each additional DFE stage (i>1) 322 and 324, the stage i includes a first additional latch 306 having an input coupled to an output the first additional latch of the previous DFE stage (i−1). The latch 306 of DFE stage i is enabled by a complement of the clock signal used to enable the first additional latch of DFE stage i−1. Each stage i for i>1 also includes a second additional latch 308 having an input coupled to an output of the second additional latch of the previous DFE stage (i−1) and is enabled by a complement of a clock used to enable the second additional latch of the previous DFE stage i−1.

For odd numbered DFE stages i (e.g., 320 and 324), a first feedback circuit, including scaling circuit 314 and summing node 312, is configured to provide a feedback signal derived from a signal output from the first additional latch 306 of that odd numbered stage to an input of the second additional latch 308 of the first DFE stage (i=1) 320 via summing node 312. A second feedback circuit, including scaling circuit 316 and summing node 310, is configured to provide a second feedback signal derived from a signal output from the second additional latch 308 of that odd numbered stage to an input of the first additional latch 306 of the first DFE stage (i=1) 320 via summing node 310.

For even numbered DFE stages i (e.g., 322), the first feedback circuit, including scaling circuit 332 and summing node 310, is configured to provide a feedback signal derived from a signal output from the first additional latch 306 of that even numbered stage to an input of the first additional latch of the first DFE stage (i=1) 320 via summing node 310. A second feedback circuit, including scaling circuit 330 and summing node 312, is configured to provide a feedback signal derived from a signal output from the second additional latch 308 of that even numbered stage to an input of the second additional latch 308 of the first DFE stage (i=1) 320 via summing node 312.

Figure 4:
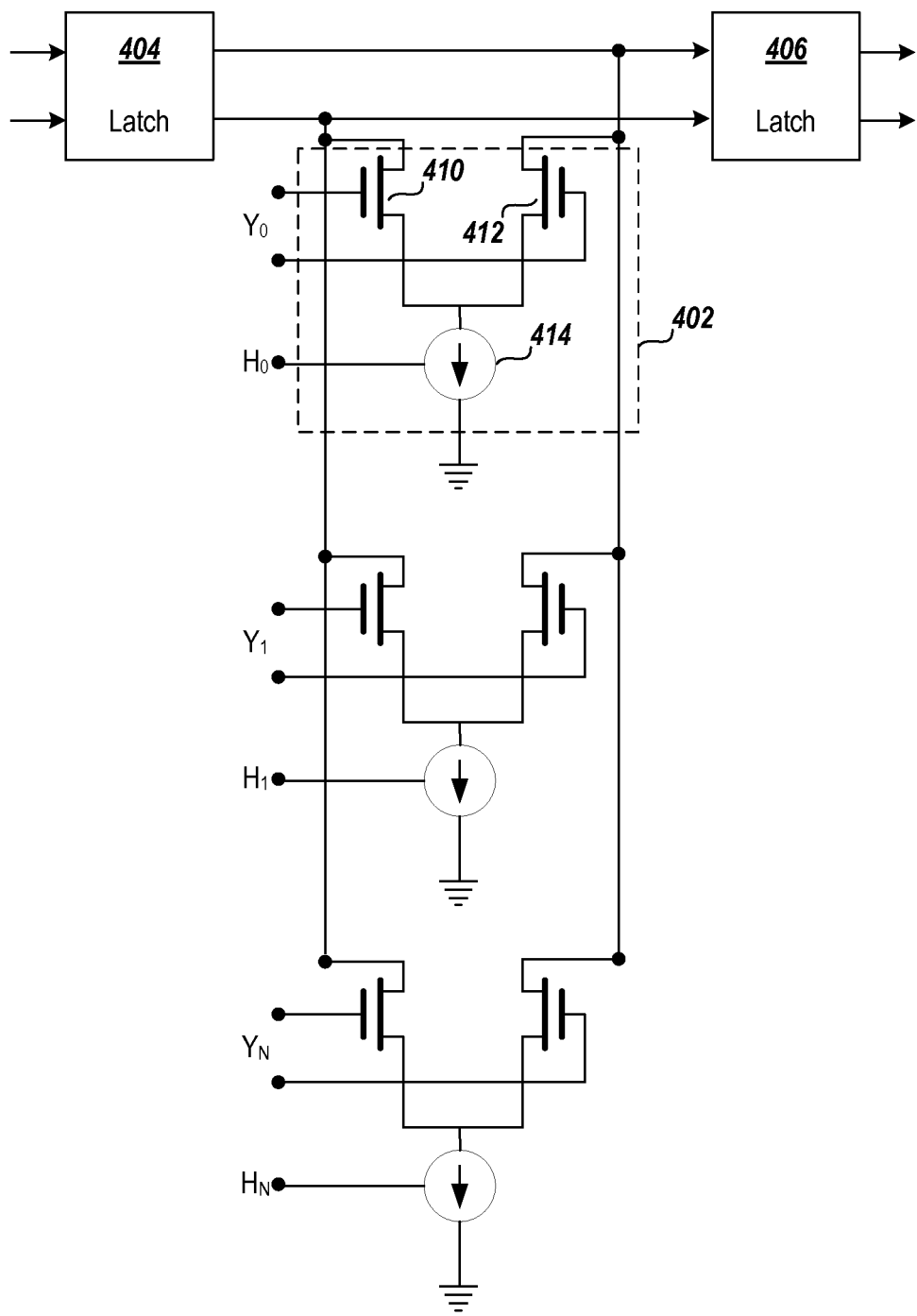
FIG. 4 shows a circuit diagram of a feedback circuit that may be used to implement the scaling circuits and summing nodes shown in FIGS. 1 and 3.

FIG. 4 shows a circuit diagram of a feedback circuit that may be used to implement the scaling circuits and summing nodes shown in FIGS. 1 and 3. While the examples are primarily illustrated with single-ended signal lines, the circuit shown in FIG. 4 is depicted with differential signaling lines for clarity. For each DFE coefficient tap, the feedback circuit includes a sub-circuit 402. The subcircuit includes a differential pair of MOSFETs 410 and 412 that are respectively coupled to the signal lines between latch 404 and latch 406 and driven by a differential signal $Y_N$ corresponding to the location of the tap. The currents passing though the differential pair are scaled by a respective weight corresponding to the coefficient $H_N$ using a variable current source 414. In this manner, the signal $Y_N$ is scaled by coefficient weight $H_N$ and summed with the signal output from latch 404.

Figure 5:
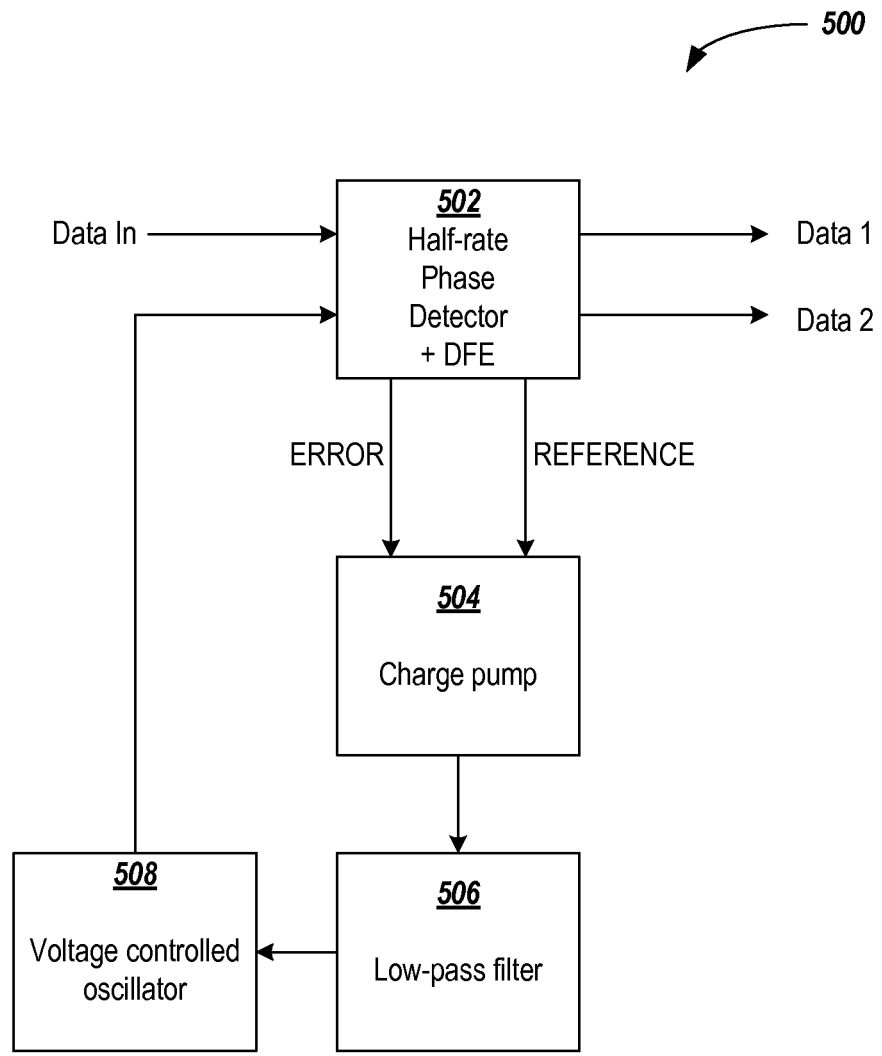
FIG. 5 shows a circuit diagram of a clock and data recovery circuit having the phase detection and DFE circuit shown in FIG. 1.

FIG. 5 shows a circuit diagram of a clock and data recovery circuit 500 that incorporates the phase detection and DFE circuit shown in FIG. 1. The clock and data recovery circuit includes a half-rate phase detector and DFE circuit 502 as described in relation to FIGS. 1 and 3, a charge pump 504, a low-pass filter 506, and a voltage controlled oscillator (VCO) 508.

A data input is provided to the half-rate phase detector 502. The half-rate phase detector compares the input data signal with the clock signal, and outputs a signal, ERROR, that is proportional to the phase error between the clock and data signals. The half-rate phase detector 502 provides ERROR, as well as the signal, REFERENCE, to charge pump 504. As described above, REFERENCE is a data-dependent signal that is used to correct for the data dependence of ERROR. Charge pump 504 provides a correction signal that is filtered by low-pass filter 506 and sent to the VCO 508. VCO 508 provides the clock signal that is used by the half-rate phase detector 502 for retiming the data input signal. These blocks form a feedback loop in which a clock signal is extracted from an incoming data stream, and used to retime the data.

The frequency of the voltage controlled oscillator is controlled by a control voltage provided by the low-pass filter 506. As the voltage output by the filter 506 changes, so does the oscillation frequency. If the input data and the clock do not have the desired phase relationship, for example, the data edges are occurring too soon, the half-rate phase detector 502 outputs an ERROR voltage. This voltage drives the charge pump 504, the output of which is filtered and applied to the VCO 508. This voltage has the result of increasing the VCO frequency such that the clock edges advance. When the desired phase relationship is achieved, the control voltage provided by the low-pass filter 506 changes such that the frequency drops back to the "correct" frequency, and this loop is said to be locked.

The frequency of the clock signal produced by VCO 508 is half the data rate of the input DATA signal. As described with reference to FIG. 1, the input data signal is demuxed by the half-rate clock into Data 1 and Data 2 by the phase detection circuitry of circuit 502. The frequency of the half-rate phase detector outputs, DATA1, and DATA2, are each half the frequency of the input DATA signal.

This architecture illustrated in FIG. 5 is shown for exemplary purposes, and is not intended to limit embodiments to any particular applications. Other architectures will be readily apparent to those skilled in the art. For example, the charge pump may be included in the low-pass filter.

Figure 6:
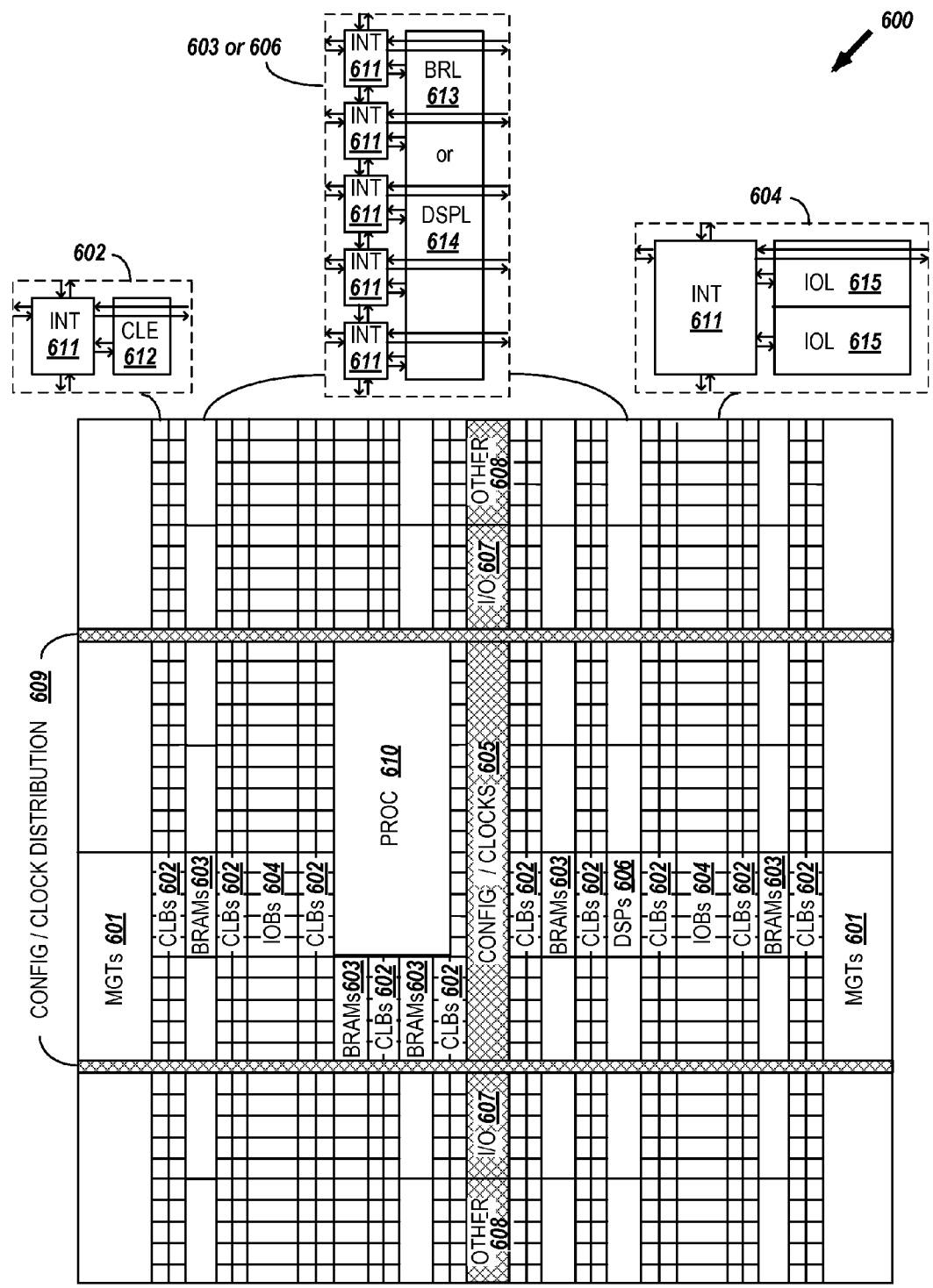
FIG. 6 is a block diagram of an example programmable integrated circuit that may be used in connection with clock and data recovery circuits in accordance with one or more embodiments.

FIG. 6 is a block diagram of an example programmable integrated circuit (IC) that may be used in connection with clock and data recovery circuits in accordance with one or more embodiments. The clock and data recovery circuits, as previously described, may be implemented throughout the programmable IC as desired. Those skilled in the art will recognize that the embodiments of the invention may be adapted for architectures different from the example architecture.

One type of programmable IC is a field programmable gate array (FPGA). FPGAs can include several different types of programmable circuits in an array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), e.g., clock ports, and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element NT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

One or more embodiments are thought to be applicable to a variety of systems in which clock and data recovery is desired. Other aspects and embodiments of the present invention will be apparent to those skilled in the art from consideration of the specification. It is intended that the specification and illustrated embodiments be considered as examples only, with a true scope and spirit of the invention being indicated by the following claims.

What is claimed is:

1. A phase detection and decision feedback equalization (PDDFE) circuit, comprising:
a first latch and a second latch coupled to an input of the PDDFE circuit, the first latch being enabled by a clock signal, and the second latch being enabled by a complement of the clock signal;
a third latch coupled in series to an output of the first latch in a master-slave configuration, wherein the third latch is enabled by a complement of the clock signal and is configured to produce a first demultiplexed signal;
a fourth latch coupled in series to an output of the second latch in a master-slave configuration, wherein the fourth latch is enabled by the clock signal and is configured to produce a second demultiplexed signal;
a fifth latch coupled to an output of the third latch in a master-slave configuration, wherein the fifth latch is enabled by the clock signal;
a sixth latch coupled to an output of the fourth latch in a master-slave configuration, wherein the sixth latch is enabled by the complement of the clock signal;
a first feedback circuit configured to provide a signal output from the first latch and a first feedback signal derived from the second demultiplexed signal to an input of the third latch, and further configured to provide a third feedback signal derived from a signal output from the fifth latch to the input of the third latch; and
a second feedback circuit configured to provide a signal output from the second latch and a second feedback signal derived from the first demultiplexed signal to an input of the fourth latch, and further configured to provide a fourth feedback signal derived from a signal output from the sixth latch to the input of the fourth latch.

2. The PDDFE circuit of claim 1, wherein the first feedback circuit includes:
a first circuit configured to scale the second demultiplexed signal by a first coefficient to produce the first feedback signal; and
a first circuit configured to sum the signal output from the first latch with the first feedback signal to produce a first corrected signal, and further configured to provide the first corrected signal to the input of the third latch.

3. The PDDFE circuit of claim 2, wherein the second feedback circuit includes:
a multiplication circuit configured to scale the first demultiplexed signal by the first coefficient to produce the second feedback signal; and
a summation circuit configured to sum the signal output from the second latch with the second feedback signal to produce a second corrected signal, and provide the second corrected signal to the input of the fourth latch.

4. The PDDFE circuit of claim 1, wherein:
the first feedback circuit is further configured to provide a third feedback signal derived from a signal output from the fifth latch to the input of the third latch; and
the second feedback circuit is further configured to provide a fourth feedback signal derived from a signal output from the sixth latch to the input of the fourth latch.

5. The PDDFE circuit of claim 1, wherein the first feedback circuit further includes:
an additional multiplication circuit configured to scale the signal output from the fifth latch by a second coefficient to produce the third feedback signal; and
a summation circuit configured to sum the signal output from the first latch with the first and third feedback signals to produce a first corrected signal.

6. The PDDFE circuit of claim 1, further comprising an error signal generation circuit including an exclusive-OR (XOR) logic gate having a first input coupled to receive the first corrected signal and a second input coupled to receive the second corrected signal.

7. The PDDFE circuit of claim 1, further comprising a reference signal generation circuit including an exclusive-OR (XOR) logic gate having a first input coupled to receive the first demultiplexed signal output from the third latch and a second input coupled to receive the second demultiplexed signal output from the fourth latch.

8. A clock and data recovery circuit, comprising:
a phase detection and decision feedback equalization (PDDFE) circuit coupled to receive a clock signal and a data signal, the PDDFE circuit configured to:
produce phase information and transition information based on the clock and data signals; and
determine data symbols from the data signal and perform feedback correction of the data signal to reduce inter-symbol interference of the data symbols; and
a charge pump coupled to the PDDFE circuit and configured to generate an error signal based on the phase information and the transition information;
a low-pass filter having an input coupled to an output of the charge pump and configured to filter the error signal; and
a voltage controlled oscillator coupled to the low-pass filter and configured to convert the filtered error signal into an oscillating signal to produce the clock signal input to the PDDFE circuit;
wherein the PDDFE circuit implements N-tap decision feedback equalization and includes:
a first latch coupled to an input of the PDDFE circuit and enabled by a clock signal;
a second latch coupled to the input of the PDDFE circuit and enabled by a complement of the clock signal;
for each tap i, $1 \leq i \leq N$:
a first additional latch having an input coupled to an output of the first additional latch of tap i−1 for i>1 and enabled by a complement of a clock signal used to enable the first additional latch of tap i−1;
wherein the first additional latch of tap i=1 has an input coupled to an output of the first latch and enabled by the complement of the clock signal used to enable the first latch; and
a second additional latch having an input coupled to an output of the second additional latch of tap i−1 for i>1 and enabled by a complement of a clock signal used to enable the second additional latch of tap i−1;
for each odd i:
a first feedback circuit configured to provide a signal output from the second latch and a feedback signal derived from a signal output from the first additional latch of tap i to an input of the second additional latch of tap 1; and
a second feedback circuit configured to provide a signal output from the first latch and a feedback signal derived from a signal output from the second additional latch of tap i to an input of the first additional latch of tap 1; and
for each even i:
a first feedback circuit configured to provide a signal output from the first latch and a feedback signal derived from a signal output from the first additional latch of tap i to an input of the first additional latch of tap 1; and
a second feedback circuit configured to provide a signal output from the second latch and a feedback signal derived from a signal output from the second additional latch of tap i to an input of the second additional latch of tap 1;
wherein the second additional latch of tap i=1 has an input coupled to an output of the second latch and enabled by the complement of the clock signal used to enable the second latch.

9. The clock and data recovery circuit of claim 8, wherein the PDDFE circuit includes for each tap i, $1 \leq i \leq N$,
for each odd i:
a first feedback circuit configured to provide a signal output from the second latch and a feedback signal derived from a signal output from the first additional latch of tap i to an input of the second additional latch of tap 1; and
a second feedback circuit configured to provide a signal output from the first latch and a feedback signal derived from a signal output from the second additional latch of tap i to an input of the first additional latch of tap 1; and
for each even i:
a first feedback circuit configured to provide a signal output from the first latch and a feedback signal derived from a signal output from the first additional latch of tap i to an input of the first additional latch of tap 1; and
a second feedback circuit configured to provide a signal output from the second latch and a feedback signal derived from a signal output from the second additional latch of tap i to an input of the second additional latch of tap 1.

10. The clock and data recovery circuit of claim 8, wherein for each tap i of the PDDFE circuit includes a multiplication circuit configured to:
multiply the output from the respective first additional latch by a respective scaling coefficient to produce the first feedback signal derived from the first additional latch; and multiply the output from the respective second additional latch by the respective scaling coefficient to produce the second feedback signal derived from the second additional latch.

11. The clock and data recovery circuit of claim 8, wherein the PDDFE circuit includes:
   a first exclusive-OR (XOR) logic gate having first and second inputs respectively coupled to the inputs of the first and second additional latches of tap 1; and
   a second XOR logic gate having first and second inputs respectively coupled to the outputs of the first and second additional latches of tap 1.

12. The clock and data recovery circuit of claim 8, wherein the charge pump is configured to subtract a signal of the transition information from a signal of the phase information to produce the error signal.

13. The clock and data recovery circuit of claim 8, wherein the phase information indicates a difference between the phase of the clock signal and the phase of the data signal.

14. A method for recovering data from an input data signal, the method comprising:
   receiving the input data signal at a first data rate;
   receiving a clock signal alternating between a high value and a low value at the first data rate;
   generating a first data signal by inputting the input data signal to a first latch enabled by the high value of the clock signal, the output of the first latch being the first data signal; generating a second data signal by inputting the input data signal to a second latch enabled by the low value of the clock signal, the output of the second latch being the second data signal;
   generating a third data signal by inputting the first data signal to a third latch enabled by the low value of the clock signal, the output of the third latch being the third data signal;
   generating a fourth data signal by inputting the second data signal to a fourth latch enabled by the high value of the clock signal, the output of the fourth latch being the fourth data signal;
   generating a fifth data signal by inputting the third data signal to a fifth latch that is enabled by the high value of the clock signal, the output of the fifth latch being the fifth data signal;
   generating a sixth data signal by inputting the fourth data signal to a sixth latch that is enabled by the low value of the clock signal, the output of the sixth latch being the sixth data signal; and
   performing decision feedback equalization by:
      providing a first feedback signal derived from the third data signal to the fourth latch;
      providing a second feedback signal derived from the fourth data signal to the third latch;
      providing a third feedback signal derived from the fifth data signal to the third latch; and
      providing a fourth feedback signal derived from the sixth data signal to the fourth latch.

15. The method of claim 14, further comprising:
   providing a third feedback signal derived from the fifth data signal to the third latch; and
   providing a fourth feedback signal derived from the sixth data signal to the fourth latch.

16. The method of claim 14, further comprising generating an error signal by XORing the first and second data signals.

17. The method of claim 14, further comprising generating a reference signal by XORing the third and fourth data signals.

* * * * *